United States Patent [19]

Layman et al.

[11] Patent Number: 4,705,951

[45] Date of Patent: Nov. 10, 1987

[54] WAFER PROCESSING SYSTEM

[75] Inventors: Frederick P. Layman, Fremont; David A. Huntley, Mountain View; Paul H. Dick, San Jose; George L. Coad, Lafayette; Michael J. Kuhlman, Fremont; Roger M. Vecta, San Jose; Phillip M. Hobson, Los Altos, all of Calif.

[73] Assignee: Varian Associates, Inc., Palo Alto, Calif.

[21] Appl. No.: 853,274

[22] Filed: Apr. 17, 1986

[51] Int. Cl.⁴ .......................... G21K 5/10; B65H 1/00
[52] U.S. Cl. ............................ 250/442.1; 250/492.21; 414/217; 414/225
[58] Field of Search ............. 250/492.21, 441.1, 442.1; 414/217, 225; 315/111.81

[56]  References Cited
U.S. PATENT DOCUMENTS 3,921,788 11/1975 Robertson et al. ................. 414/222
4,228,358 10/1980 Ryding ............................. 250/442.1
4,341,502 7/1982 Makino .
4,408,126 10/1983 Tojo ................................. 250/442.1
4,433,951 2/1984 Koch et al. ......................... 414/217
4,483,654 11/1984 Koch et al. ..................... 414/744 R
4,523,985 6/1985 Dimock ............................. 414/217
4,533,069 11/1985 Purser ............................ 315/111.81
4,585,389 4/1986 Watanabe et al. .................. 414/225
4,599,516 7/1986 Taya ............................. 250/492.21
4,648,785 3/1987 Nakagawa et al. .

Primary Examiner—Bruce C. Anderson
Attorney, Agent, or Firm—Stanley Z. Cole; Gerald M. Fisher; Kenneth L. Warsh

[57]  ABSTRACT

A wafer processing system including wafer handling arms incorporated into vacuum isolation valves is described. A loadlock with elevator and optical sensors is used to inventory and position a cassette of wafers. The wafers in the cassette can be randomly accessed. A computer is used to control the system according to a task status table independent of time sequence.

16 Claims, 19 Drawing Figures

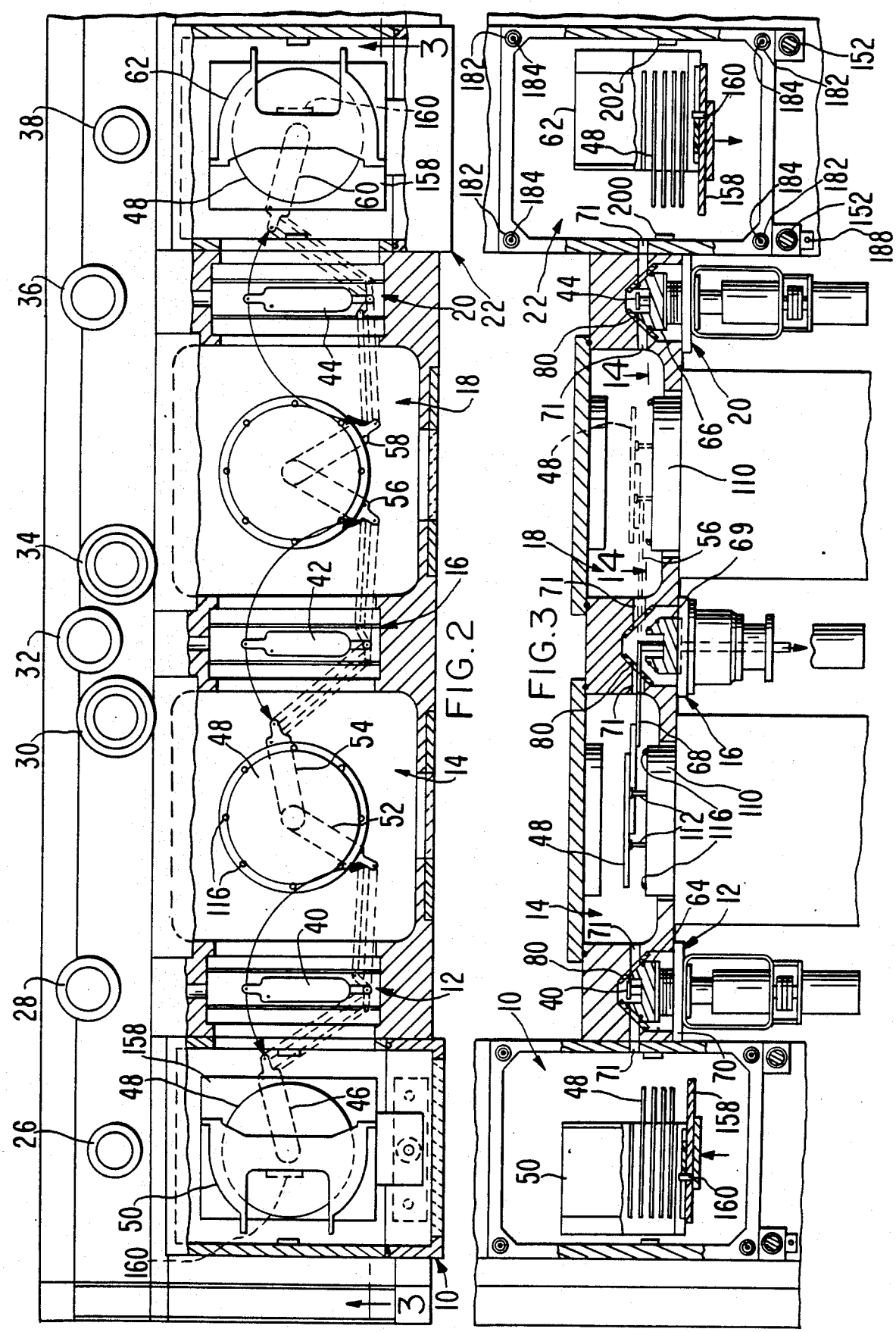

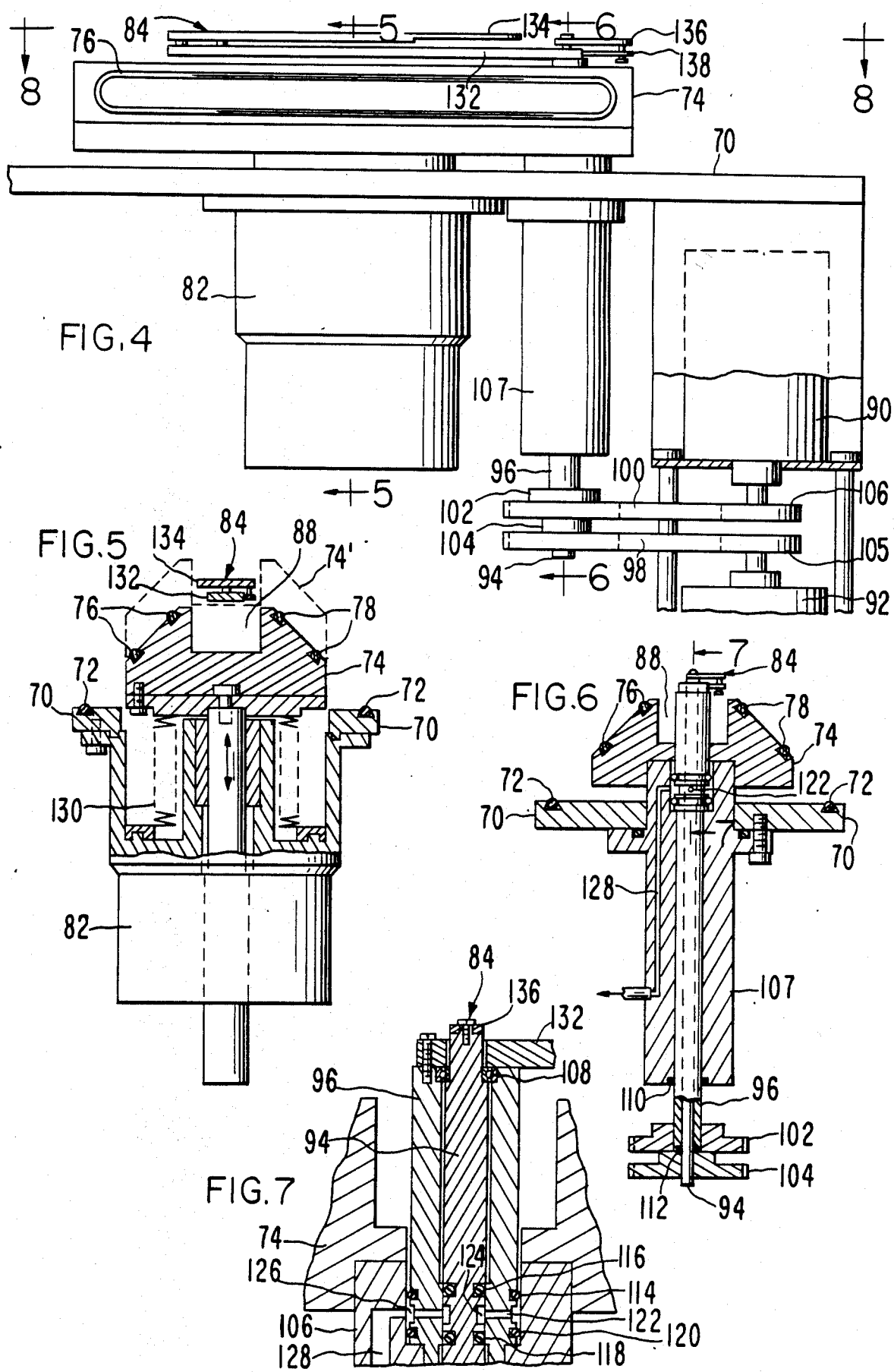

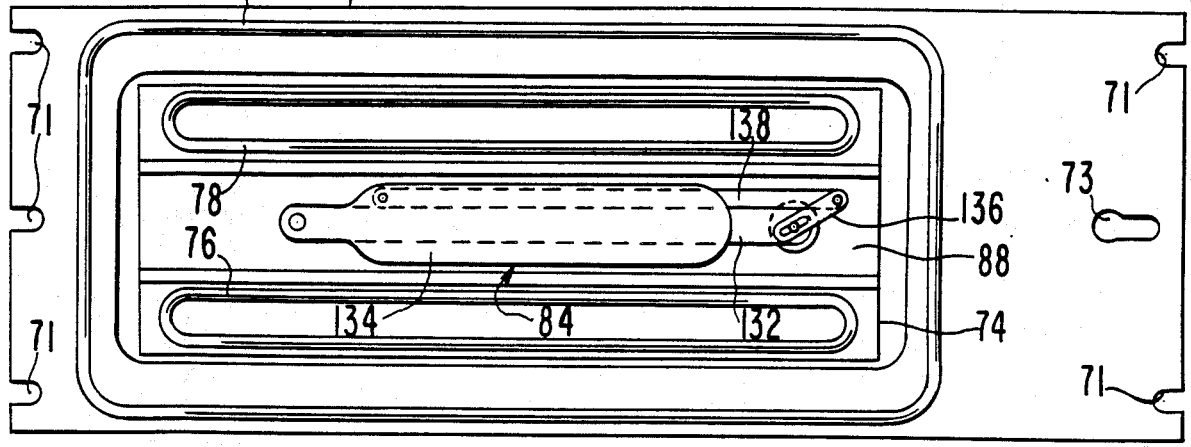
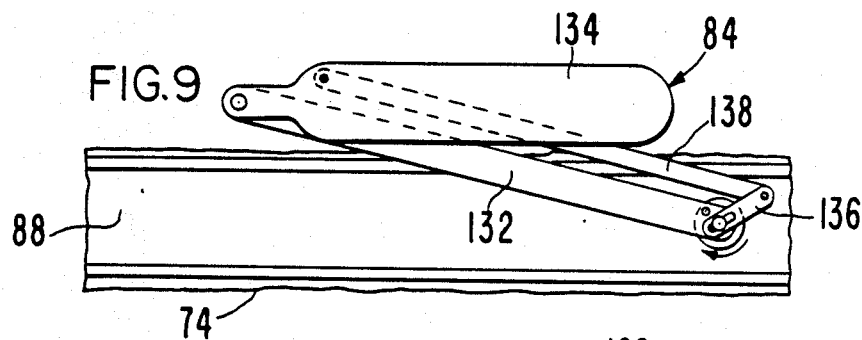
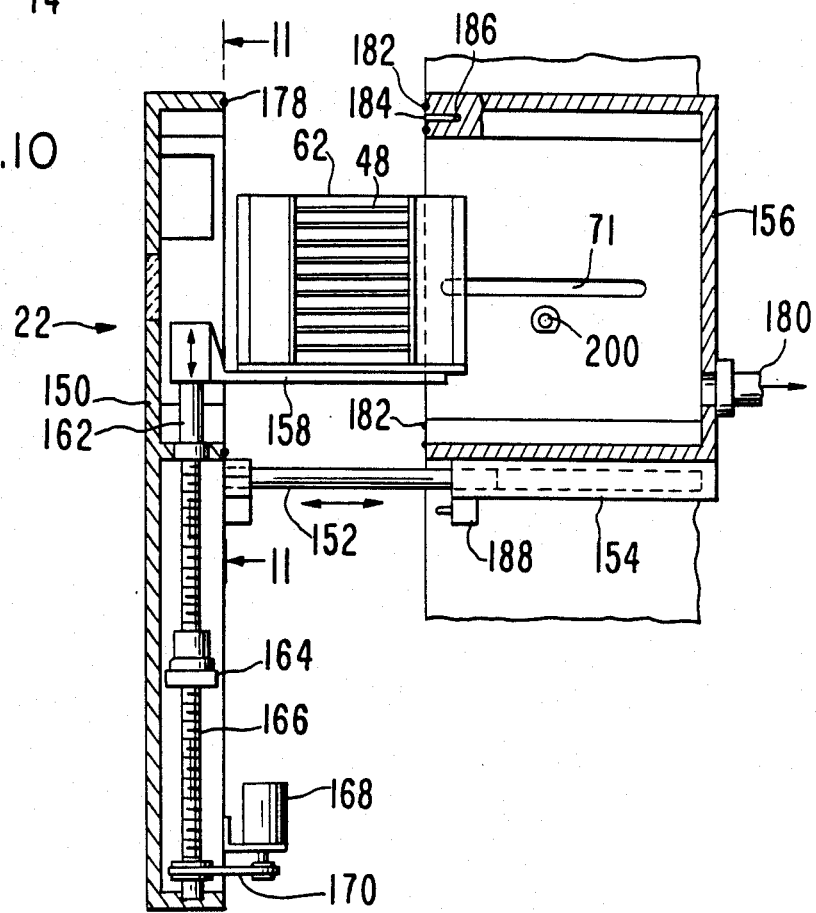

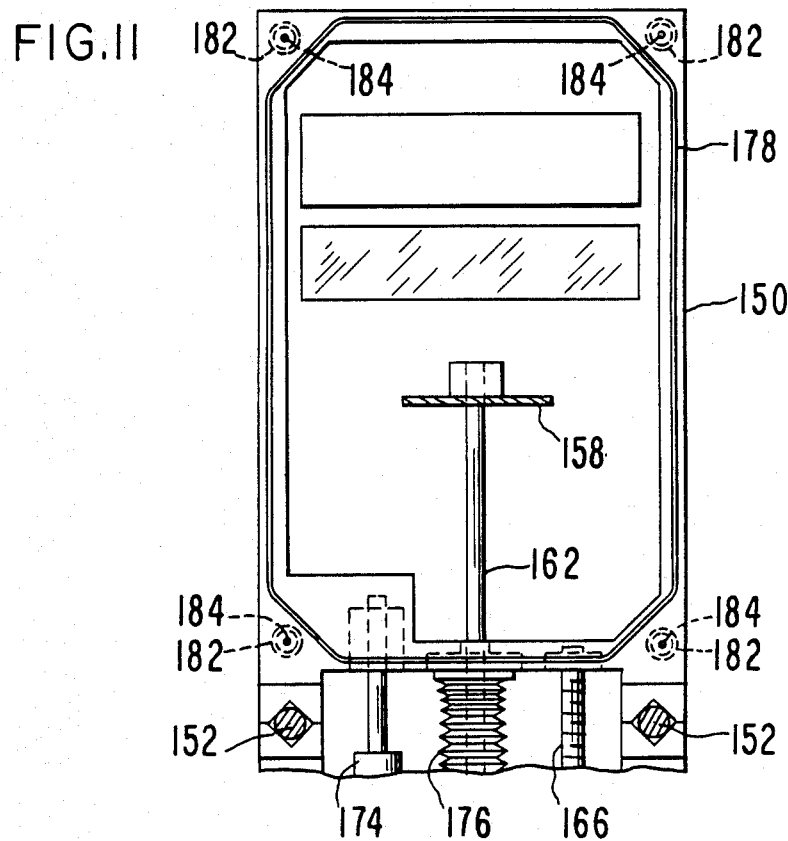
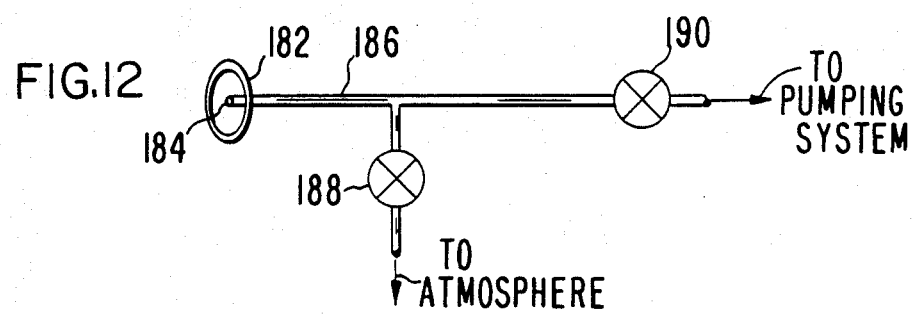
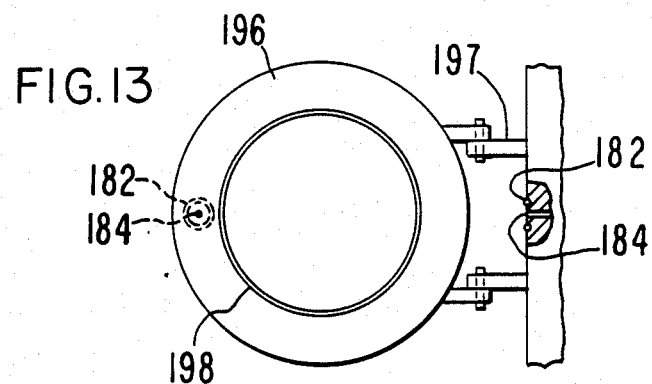

FIG. 19

| MACHINE TASK | TASK STATUS |
|---|---|
| VENT/PUMP DOWN SENDER LOAD LOCK (SND) | 1 |
| INDEX SENDER ELEVATOR (SNM) | 2 |
| MOVE THROUGH VALVE #1 (W1M) | 3 |
| PROCESS WAFER IN CHAMBER #1 (C1P) | 4 |
| MOVE THROUGH VALVE #2 (W2M) | ANY |
| PROCESS WAFER IN CHAMBER #2 (C2P) | |
| MOVE THROUGH RECEIVER VALVE (WRM) | |
| VENT/PUMP DOWN RECEIVER LOAD LOCK (RCV) | |

WAFER PROCESSING SYSTEM

FIELD OF THE INVENTION

This invention pertains to a system for processing semiconductor wafers sequentially using robot arms stored inside isolating valves between multiple sequential chambers.

BACKGROUND OF THE INVENTION

Removal techniques, e.g., etching and cleaning, are universally practiced on semiconductor materials, metal materials, and/or dielectric materials in the production of electronic devices and/or materials. Because of the importance of these procedures, extensive research has been expended in improving established techniques and developing novel approaches. Through this research, processing times have been significantly diminished, and the quality of these processes has been substantially improved.

As semiconductor wafer processing machines move toward more automation, cassettes are used to move the wafers from one machine to another. The cassettes in many cases, are made of soft plastic to avoid damage to the wafers. Such cassettes, however, are subject to warping and deformation in use and are not dimensionally stable. Sometimes wafers are broken or otherwise removed from the group of wafers in the cassette, thereby creating a blank space in the cassette. Valuable processing time is thereby wasted.

Semiconductor wafer processing requires many steps in many processing chambers. Isolation means must be provided between chambers and means for moving wafers must be provided compatible with the isolation. All this must be provided in a way which generates a minimum of particulates which might contaminate the wafer. Generally, isolation is provided by valves and wafer movement is handled by an independent mechanism.

U.S. Pat. Nos. 4,433,951 and 4,483,654 to Koch et al disclose a transfer mechanism in an isolation chamber. Separate valves are required on either side of the isolation chamber. The transfer mechanism within the isolation chamber is complex and prone to particulate generation problems.

U.S. Pat. No. 4,533,069 to Purser discloses a wafer handling arm having four trapezoidally-shaped sides. The side arms extend sideways as the arm is shortened, thereby requiring a large opening in which to operate the arm.

U.S. Pat. No. 3,921,788 to Roberson, Jr. et al discloses a wafer handling mechanism on a slide mechanism. The slide mechanism is inherently present in the work area and subject to generation of particulates.

In prior art wafer processing machines the holding of the semiconductor wafer was often a simple device since the wafers were loaded by hand. As semiconductor processing moved into more sophisticated sequential automated processing, wafer handling means had to be devised which would pass a wafer to a wafer holding device. Where it is necessary to temperature regulate the wafer during processing, various means can be employed. Heat transfer problems arise where a temperature controlled chuck is used in a vacuum to regulate the temperature of a wafer. One of the most reliable heat transfer means is to provide gas at the back of the wafer at a pressure between 3 and 20 Torr (depending on the process) and allow this gas to equilibrate the temperature of the chuck and wafer through conduction and/or convection as shown in U.S. Pat. Nos. 4,512,391; 4,514,636; and 4,565,601. In order to efficiently control the temperature of the wafer it is necessary that the wafer holding means clamp the wafer firmly to the temperature controlled chuck. The wafer clamping means and handling means must interact in a reliable manner.

OBJECTS OF THE INVENTION

It is an object of the invention to combine a chamber vacuum isolation valve with a simple compact wafer handling arm including a means of completely isolating the wafer handling arm from the chamber on either side of the valve when the valve is closed, and including a means for pumping continuously on the valve housing and the wafer handling arm in any valve position.

It is a further object of the invention to provide a wafer positioning system which compensates for distorted individual wafer cassettes.

It is another object of the invention to provide a wafer positioning system which takes into account wafers missing from the cassette and provide random access to wafers in the cassette.

It is a still further object of the invention to provide a means of holding the door of a vacuum chamber until pumping on the chamber begins in a way which can be electrically controlled.

It is still another object of the invention to provide reliable means for receiving a wafer from a wafer positioning system centering and clamping on a temperature controled chuck.

It is a still further object of the invention to provide means for controlling efficient and rapid processing of the wafers without fixed sequential control.

It is another object of the invention to provide a wafer handling and processing system wherein a combined isolation valve and wafer handling arm are removeable as a unit from the system to enable rapid removal of a worn unit and replacement with a new or rebuilt unit, so that the entire system will not be incapacitated for a long period when the valve sealing rings and moving parts of such unit become worn.

SUMMARY OF THE INVENTION

These objects of the invention and other objects, features and advantages to become apparent as the specification progresses are accomplished by the invention, according to which, briefly stated, a wafer handling arm is formed of a proximal extensor piece, a distal extensor piece, a proximal support arm, and a distal support arm. The distal extensor piece and the proximal support arm are pivotally attached to the distal support arm at two different points. The proximal extensor piece is pivotally attached to the distal extensor piece. The proximal extensor piece and the proximal support arm are each connected fixedly to a one of a pair of concentric shafts. Rotating one shaft rotates the entire arm. Rotating the other shaft extends or retracts the arm. The distal support arm is formed as a flat blade with cushions to support the wafer. The wafer handling arm is mounted through the center of the moveable wedge of a valve. A space at the center of the wedge valve is used to provide storage for the arm folded closed when the valve is closed. A pumping port is provided in the valve housing for pumping on the arm when the valve is closed (or open depending on process requirements).

There are provided input and output loadlocks equipped with elevators and optical sensors connected to a computer operated in a manner so that the position and presence of each wafer in a cassette slot is measured and recorded in the computer. The computer is programmed to skip blank slots and to move a manipulator apparatus to find the wafer at the measured position or to move the wafer into a measured position of an empty slot. The manipulator is also designed in such a manner that wafers may be removed or inserted in a cassette in a nonsequential order.

Small vacuum chambers are formed in the walls of the larger vacuum chamber (or the door). Each small vacuum chamber is surrounded by a sealing means at the front opening of the small chamber. The surface of the door (or chamber) where it contacts the sealing means is smooth and conforms to the seal as the door is closed. Pumping on the small vacuum chamber holds the door closed while the larger vacuum chamber is evacuated. After the larger chamber is returned to atmospheric pressure, a switch in the door handle operates electrically actuated valves which stop the pumping on the small chambers and vents them to the atmosphere.

In one embodiment of a wafer holding means, a group of lifting pins receives the wafer from the transport device and lowers the wafer to the surface of a temperature controlled chuck. A group of holding pins then lowers to center and clamp the wafer to the chuck. The lifting pins and the holding pins are driven from a common shaft drive mechanism to provide foolproof mechanical interlock of the lifting and holding functions.

In another embodiment of a wafer holding means, a group of lifting pins receives the wafer from the transport device and lowers the wafer to the surface of a temperature controlled chuck. A group of thin holding clamps then pivot and lower to center and hold the wafer to the chuck. The clamps are made thin so that from 3 to more than 70 may be closely placed around the rim of a 6-inch wafer. The clamps are driven from two rings around the chuck. One ring lifts and lowers all clamps. The second ring pivots all clamps over the wafer. To provide good thermal transfer between the chuck and the wafer, helium is led in the chuck through channels into grooves on the face of the chuck. The temperature of the chuck is controlled by means of heaters, water cooling, temperature sensors and a control computer. By this means, a helium pressure of greater than 3 Torr can be maintained at the backside of the wafer while maintaining a vacuum (less than 1 Torr) at the wafer surface.

These and further constructional and operational characteristics of the invention will be more evident from the detailed description given hereinafter with reference to the figures of the accompanying drawings which illustrate preferred embodiments and alternatives by way of non-limiting examples.

BRIEF DESCRIPTION OF THE DRAWINGS

FIG. 2 shows a partial section through the system of FIG. 1 along the section line 2—2.

FIG. 3 shows a section through the system of FIGS. 1 and 2 along the section line 3—3.

FIG. 4 shows the valve and wafer handling arm in side view.

FIG. 5 shows the device of FIG. 4 in section along the line 5—5.

FIG. 6 shows the device of FIG. 4 in section along the line 6—6.

FIG. 7 shows the device of FIG. 4 in section along the line 7—7.

FIG. 8 shows the device of FIG. 4 in top view.

FIG. 9 shows the wafer handling arm of the device of FIG. 4 in partially extended position.

FIG. 10 shows the door of the loadlock as shown in FIG. 1 in side partial sectional view along the line 10—10.

FIG. 11 shows the arrangement of seals of the door of the loadlock of FIG. 10 along the the line 11—11 with the position of the soft latch shown in phantom.

FIG. 12 is a schematic of the valve arrangement used to control the soft latch according to the invention.

FIG. 13 is a front view of an alternate application of the soft latch according to the invention.

FIG. 19 is a diagram of the task locator system.

DESCRIPTION OF THE PREFERRED EMBODIMENTS

Figure 1:
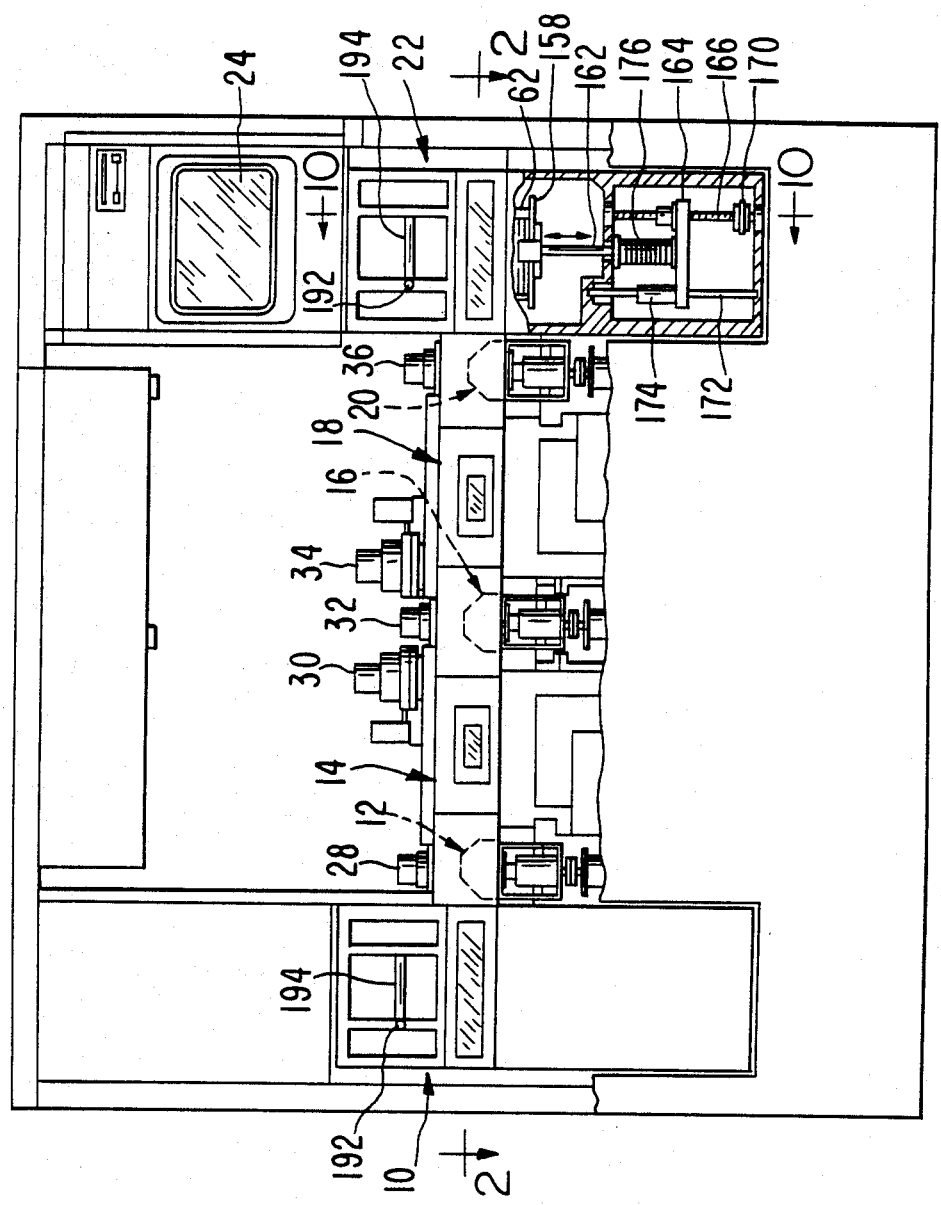
FIG. 1 shows a front view in partial section of a wafer processing system according to the invention.

Referring now to the drawings wherein reference numerals are used to designate parts throughout the various figures thereof, there is shown in FIG. 1 a front view in partial section of a wafer processing system according to the invention. An input load-lock 10 is used to load a cassette of wafers. An isolation valve 12 is located in the path of the wafer before the first processing chamber 14. A second isolation valve 16 is located in the path of the wafer before the second processing chamber 18. A third isolation valve 20 is located between the second processing chamber 18 and the output loadlock 22. A computer 24 with controls through a keyboard and touch-screen is used to control operation of the system. Separate vacuum pumping connections 26, 28, 30, 32, 34, 36 and 38 are made to each of the loadlocks 10, 22, valves 12, 16, 20 and processing chambers 14, 18. Each pumping connection is controlled from the computer 24. Only two processing stations are shown in this example, but any number of processing stations and isolation valves can be used in series.

FIG. 2 shows a partial section through the line 2—2 of the system of FIG. 1 and FIG. 3 shows a partial section of the same system through the line 3—3. In FIG. 2, wafer handling arms 40, 42, 44 are shown in solid lines in the stored position. Wafer handling arm 40 is shown in dotted lines 46 taking a wafer 48 from a cassette 50. Wafer handling arm 40 is shown in dotted lines 52 placing the wafer 48 in the processing chamber 14. Similarly, wafer handling arm 42 is shown in dotted lines 54 as it picks up the wafer in the first processing chamber 14 and in dotted lines 56 as it places the wafer in the second processing chamber 18. Wafer handling arm 44 is shown in dotted lines 58 taking a wafer from the second processing chamber 18 and in dotted lines 60 placing the wafer in the output cassette 62.

In FIG. 3, the wafer handling arms 40, 44 are shown in the stored position inside valves 12, 20 with the valve wedge 64, 66 seated in the closed position. The wafer handling arm in the valve 16 is shown in solid lines 68 in the first processing chamber 14 and in dotted lines 56 in the second processing chamber 18. The valve wedge 69 of the valve 16 is shown in the open position, showing that the handling arm can move through the opening 71 in the valve seat in either direction.

Further details of an individual of the valves and wafer handling arms as previously described are shown in FIGS. 4-9. The device is shown in FIG. 4 in side view. A plate 70 with sealing O-ring 72 is used to seal the valve and wafer, handling arm into the system. As shown in FIG. 3, the plate 70 is positioned in abutment with the main frame of the system. FIGS. 4-6 show that the valve wedge 74 and its operating mechanism, and the wafer handling arm 84 and its operating mechanism, are all attached to plate 70 to form a unitary structure. FIG. 8 shows that plate 70 is provided with slots 71 and an aperture 73 to receive bolts (not shown) for attaching the valve and wafer arm unit to the main frame of the system. This construction makes it possible to remove and replace the valve and wafer arm quickly as a single unit, and without dismantling any other portion of the system.

The valve wedge 74 has O-rings 76, 78 on either side to seal to the valve seat 80 (shown in FIG. 3). A linear actuator 82, which may be pneumatically, hydraulically or electrically driven, is used to drive the valve wedge 74 upward into the seat 80. This upward movement is shown in FIG. 5 with the valve wedge 74 shown in dotted lines in the uppermost closed position.

The wafer handling arm 84 remains at the same height in the system regardless of whether the valve wedge 74 is in the uppermost closed position or the lowermost open position. The valve wedge 74 has a storage notch 88 to allow the valve wedge 74 to pass around and seal the arm 84 within the valve.

The wafer handling arm 84 is provided with two rotary actuators 90, 92 which drive concentric shafts 94, 96 through toothed belts 98, 100 and toothed pulleys 102, 104, 105, 106. The concentric shafts 94, 96 are mounted in a shaft holder 107 and supported at the top and bottom with roller bearings 108, 110, 112. In order to provide good rotating vacuum seal to the shafts, two pairs of O-rings 114, 116, 118, 120 are provided around each shaft. A hole 122 is provided through the outer shaft 96 which is in communication with a groove 124 on the inner shaft 94. A groove 126 on the outer shaft 96 communicates with the hole 122 and a pumping outlet 128 in order to provide other vacuum pumping or pressurization between each pair of O-ring seals on each shaft. A bellows seal 130 is provided between the valve wedge 74 and the plate 70.

The handling arm 84 is made of four smaller pieces. A proximal support piece 132 is fixedly attached at a right angle at a first end to the outer shaft 96. A distal support piece 134 is pivotally attached at one end to the other end of the proximal support piece 132. A proximal extensor piece 136 is fixedly attached at a right angle at a first end to the inner shaft 94. A distal extensor piece 138 is pivotally attached at one end at the second end of the proximal extensor piece 136. The distal extensor piece 138 is pivotally attached at the second end of the distal support piece 134. The attachment points on the distal support piece 134 to the proximal support piece 132 and distal extensor piece 138 are separated by the dimension on the proximal extensor piece 136 between the attachment points. The proximal extensor piece 136 can be much shorter than the proximal support piece 132. The smaller the proximal extensor piece 136 relative to the proximal support piece, the smaller the arm can be when in the folded position. The four pieces of the arm should form a pareallelogram between the attachment points and the shaft axis. If all four arm pieces are formed as blades, the pivotal attachments can be loosely fixed rivets. As the outer shaft 96 is rotated the entire arm rotates. As the inner shaft 94 is rotated relative to the outer shaft, the arm extends or folds.

The arm thus described can be moved such that the tip holding the wafer moves in any complex trajectory by independently rotating the concentric shafts. The small space required to store the arm permits the arm to be stored within an isolation valve housing. The housing of the valve can be formed as a separate unit or as an integral part of the process chambers as shown previously. Mounting the driving means for the arm and make as shown previously permits the moving parts to be removed and replaced as a unit quickly, thus minimizing downtime.

The valve may be pumped by the same pumping system as is used for the process chamber, either simultaneously or by time-sharing the pumping mechanism through alternating valves. If simultaneous pumping is necessary, the chemically active process gas being pumped out of the process chamber will backstream into the valve housing. This can be prevented by maintaining a small flow of an inert gas into the valve housing to continuously flush the housing and pump line. This flow can be as little as 5 cc/min.

In FIGS. 1 and 10, the loadlock and elevator mechanism according to the invention is shown. The loadlock door 150 has attached to it a pair of rods 152 which ride on bearings 154 mounted to the outside of the loadlock chamber 156. The cassette 62 rides on a table 158 which is keyed to sit the cassette 62 in only one position. A microswitch 160 or other equivalent sensor is used to detect the cassette 62 when it is seated properly. The computer which controls the system is programmed to hold the loadlock door 150 open until the cassette 62 is properly seated. The table 158 rides on a shaft 162 which terminates in a bar 164. The bar 164 is driven by a screw 166 from a motor 168 and pulley 170. A guide rod 172 and bearing 174 is used to steady the elevator. A bellows 176 seals the chamber 156 to the bar 164 to provide vacuum sealing around the shaft 162.

As shown in FIGS. 1, 10 and 11, there is an O-ring 178 located on the back of the door 150 which seals to the surface of the chamber 156 when the door is pushed closed. The main locking mechanism of the loadlock is the pressure of the atmosphere on the door 150 when the chamber 156 is evacuated through the pumping port 180. To aid in compressing the O-ring 178 and in holding the door 150 until the pressure in the chamber 156 drops enough to hold the door 150 closed, a vacuum or soft soft latch is provided.

The soft latch is comprised of as many as four O-ring seals 182, preferably of neoprene foam, mounted in the walls of the chamber 156 outside the O-ring 178 as shown in FIG. 11. These O-ring seals may be configured in a shape and size adequate to provide sufficient force to hold the door in intimate contact with the O-ring 178. The neoprene foam O-ring can be of the open-celled or closed-cell types, but a soft closed-cell neoprene O-ring works particularly well. FIG. 11 is a view of the rear of the door as an example, with the position to which the O-ring seals 182 mate shown in phantom (since the seals 182 are on the face of the chamber). The O-ring seals 182 can be on the door, but it is more convenient to run the pumping channels through the chamber. Each seal 182 seals to a smooth surface on the back of the door 150 if the seals are on the chamber as illustrated. If the seals are on the door, the smooth surface is on the chamber. At the center of each seal 182 a hole 184 leads through a channel 186 to a valve and pumping system as shown in FIG. 12. A microswitch detector 188 detects the closing of the door 150. The valve to atmosphere 188 is closed and the valve to the pumping system 190 is opened in sequence. The vacuum drawn under the seals 182 then hold the door 150 closed. If it is necessary to open the chamber 156 by hand before evacuating the chamber, a switch 192 on the handle 194 is used to close the valve 190 to the pumping system and open the valve 188 to the atmosphere in sequence. The seals 182 then release the door. Once the pumping on the chamber 156 has begun, the soft latches are automatically released by the computer 24. Thus, it is advantageous to locate the soft latch outside the main O-ring seal 178. This system of soft latching is particularly advantageous for automatic handling of the cassettes.

Depending on the size of the door and the closeness of fit of the mounting system, two to four or more soft latches may be necessary. For a small door with a well-fitted hinge, a single soft latch of sufficient size will be adequate. In FIG. 13 there is shown an embodiment where a door 196, mounted on a hinge 197 and having only one sealing O-ring 198, has a single seal 198 mounted on the chamber to act as a soft latch. The position where the soft latch contacts the door is shown in phantom.

Because cassettes become worn or otherwise deformed, the position of a wafer relative to the elevator mechanism cannot be determined from a known geometry of a cassette. Also, wafers might be broken or discarded in previous processing steps and thus missing from cassette slots. In order to compensate for these problems there is included in the chamber an optical or infrared transmitter 200 and a matching optical or infrared detector 202 on the opposite side of the chamber 156 at the same height. As the chamber 156 is being evacuated, the elevator table 158 is driven up and then down. As each wafer passed through the beam from the transmitter 200, the interruption of the beam is sensed at the detector 202. The interruptions are recorded in the control computer 24 and associated hardware. The elevator is driven at a constant known speed so that position is known from the product of speed and time. Position is measured relative to the elevator table 158. Thus, position of each slot of the cassette and presence of each wafer is known. The control computer 24 is then programmed to pick up each wafer at the measured position in the computer memory and to skip cassette spaces where there is no wafer. The combination of wafer handling mechanism described before and wafer positioning system permits the system to be operated with random access to the wafers in the input cassette and random selection of cassette spaces to store the outgoing wafer.

Figure 14:
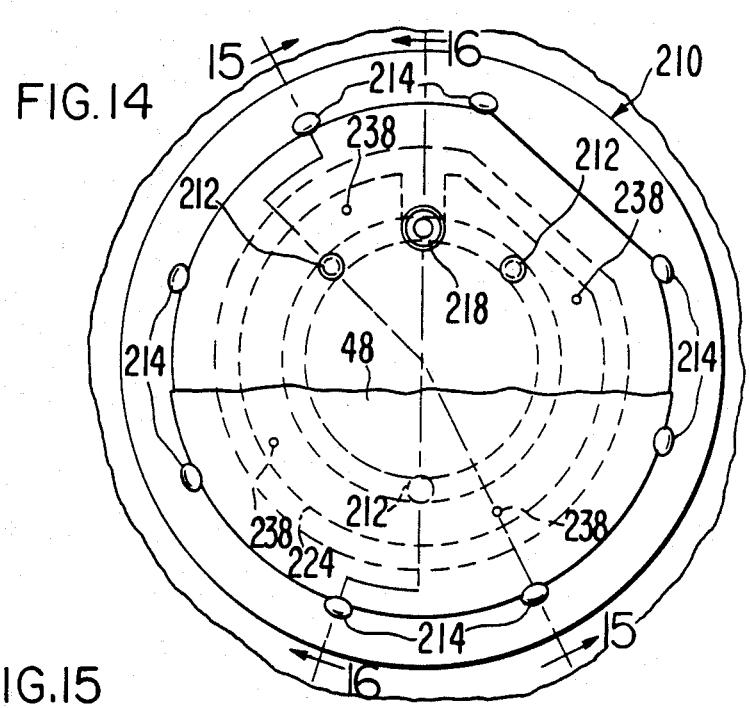
FIG. 14 is a top view of the wafer holding chuck according to the invention.
Figure 15:
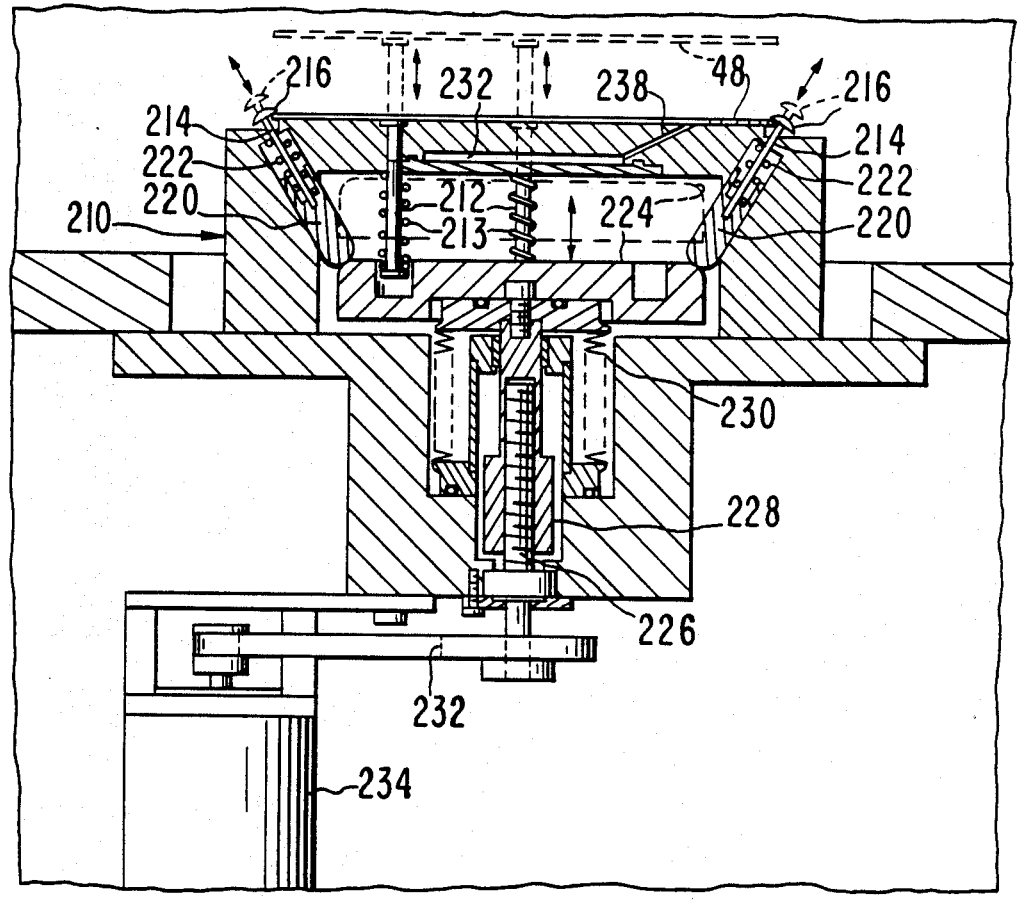
FIG. 15 is a sectional view of the chuck of FIG. 14 along the line 15—15.
Figure 16:
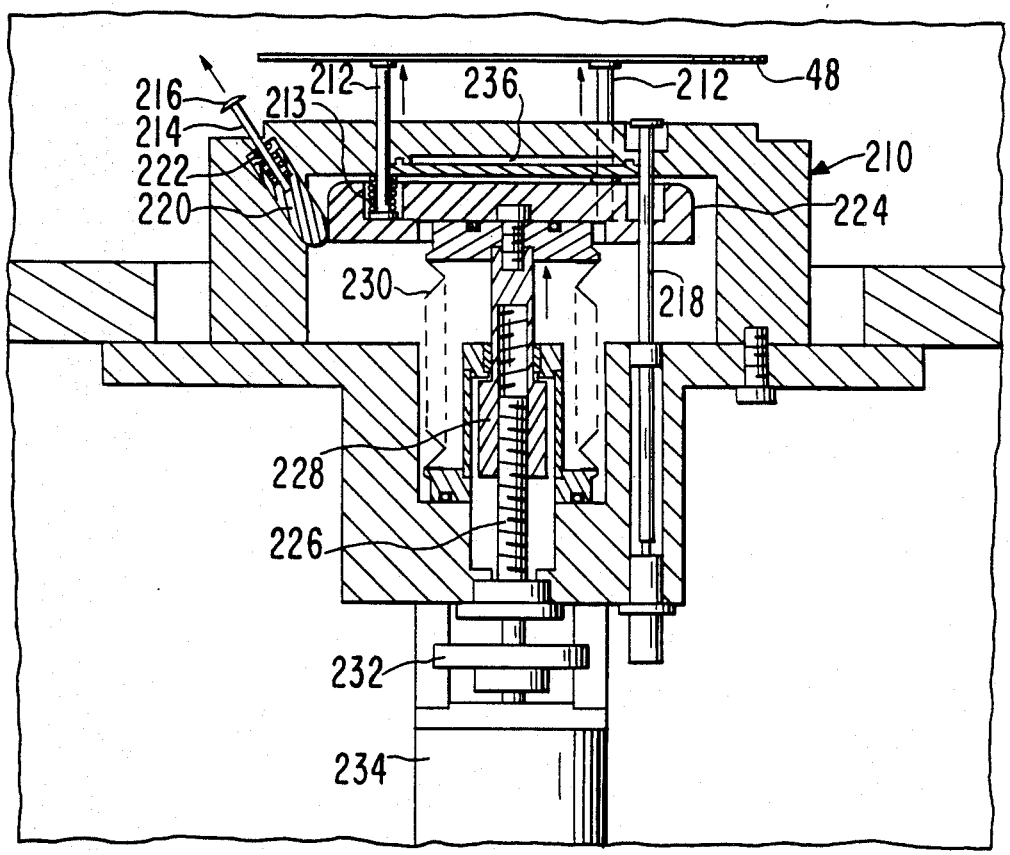
FIG. 16 is a sectional view of the chuck of FIG. 14 along the line 16—16.

In FIGS. 14–16 there is shown the device for receiving, centering and holding the wafer during processing according to the invention. The wafer is centered over the chuck platform 210 using the wafer handling arm. Lifting pins 212, in combinations of 3 or more, are raised under the wafer to lift the wafer off the handling arm. The handling arm is then withdrawn from the chamber. The wafer is then left on the lifting pins 212 with the pins in the extended position as shown in dotted lines in FIG. 15 and solid lines in FIG. 16. At the same time the lifting pins 212 are extended upward, the holding pins 214 are extended upward at a slant away from the wafer. Each holding pin 214 has a head enlargement 216 which is larger in diameter than the shaft of the holding pin. The head enlargement 216 may be formed as a small disk, cylinder or other object. The head enlargement 216 must be sufficiently large and abrupt to catch the edge of the wafer. As the lifting pins 212 are drawn downward by the springs 213 to place the wafer on the top of the chuck platform 210, the holding pins 214 clamp the edge of the wafer with the heads 216. There may be two or more holding pins 214, but the more holding pins 214 the more firmly the wafer is held to the chuck. A capacitative sensor 218 is used to confirm the seating of a wafer on the chuck.

Each holding pin 214 is fixed to a pin holder 220 which forms a guide for the pin. Each pin holder 220 is driven downward by a spring 222. The lifting pins 212 and the holding pins 214 are driven in common by a lifting table 224. The lifting table 224 has a rounded upper rim and the pin holder 220 has a rounded lower end to facilitate a smooth sliding motion of the pin holder 220 on the lifting table 224. The lifting table 224 is driven upward on a threaded shaft 226 and threaded cylinder 228. A bellows and O-ring seal 230 around the threaded cylinder 228 is used as a vacuum seal. The threaded shaft 226 is driven by a pulley 232 and motor 234.

A wafer clamped firmly to a chuck platform 210 as previously described can be heated or cooled from the backside by gas fed from the interior of the chuck, the gas being used as a heat transfer medium between the chuck and the wafer. Within the chuck platform 210, a plenum 236 is fed gas through an internal channel (not shown) from a source outside the vacuum. Radial channels 238 are used to feed the gas into a series of radial, concentric or combination (of radial and concentric) grooves on the surface of the chuck (not shown). Leakage of gas from under the wafer necessitates a continuous flow of gas. The temperature of the chuck is monitored with sensors and thereby regulated.

Figure 17:
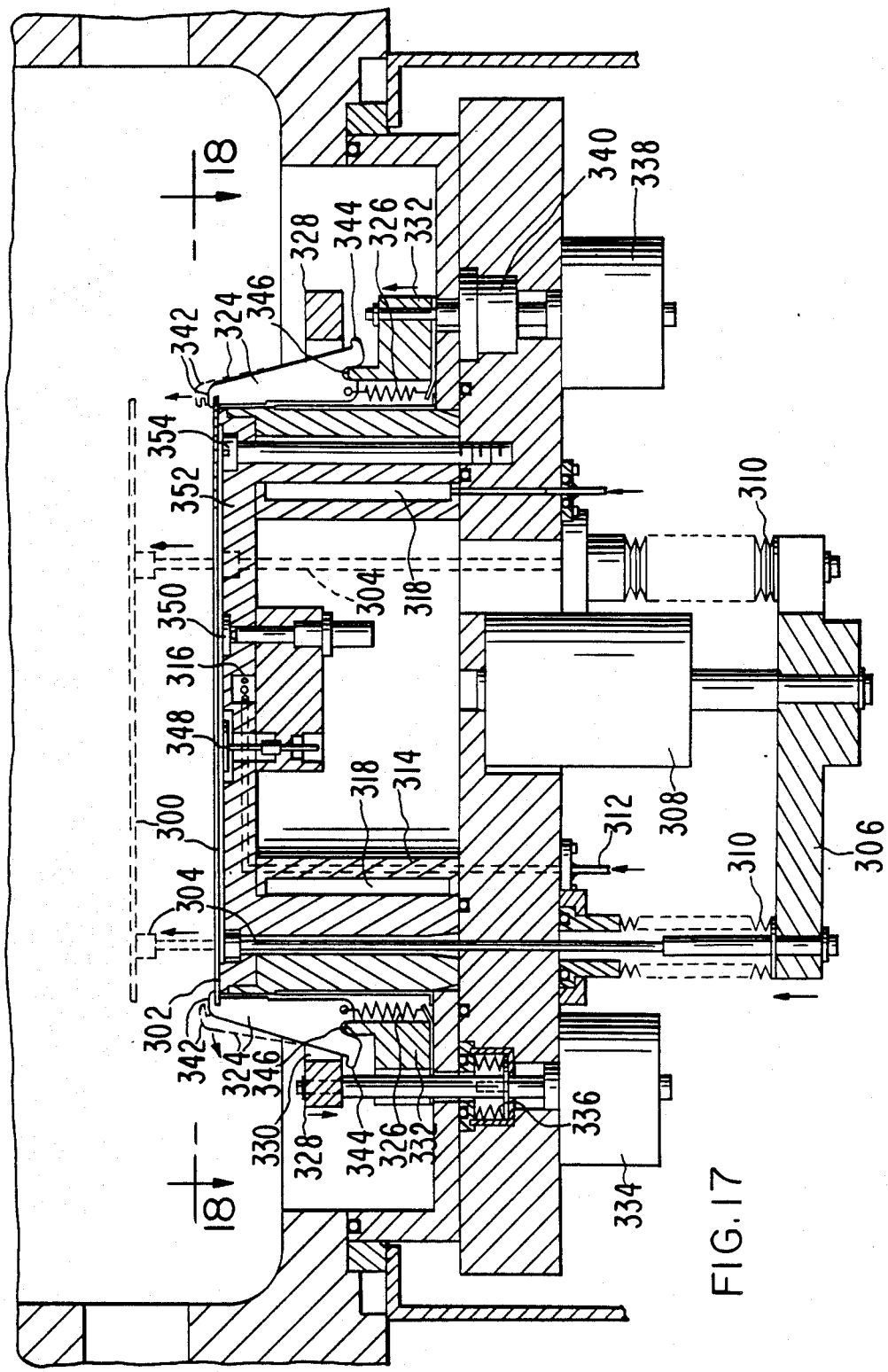
FIG. 17 is a sectional view of another embodiment of the wafer holding chuck according to the invention along the line 17—17 of FIG. 18.
Figure 18:
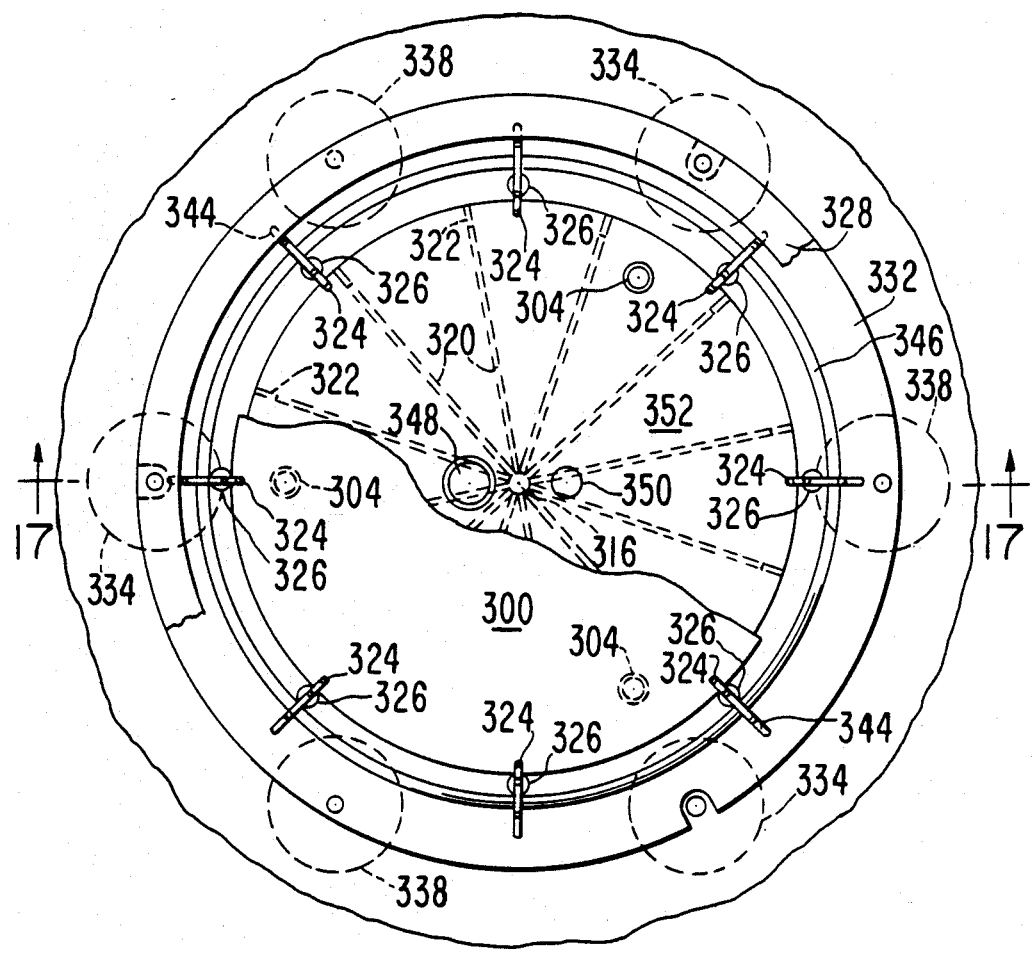
FIG. 18 is a partial sectional view from the top of the chuck of FIG. 17 along the line 18—18.

Another chuck is shown in FIGS. 17 and 18. In some applications where it is preferable to use helium gas it is necessary to provide clamping means to seal the wafer more firmly to the surface of the chuck. In this chuck, the wafer 300 is shown on the chuck surface 302. Three or more lifting pins 304 lift the wafer 300 off the handling arm as shown in phantom in FIG. 17 and lower the wafer 300 to the surface 302. The pins 304 are attached to a spider 306 and driven by a pneumatic actuator 308. Bellows 310 provide vacuum seals around the pins. Temperature control gas is introduced at the inlet 312 and passes through an interior channel 314 to a central well 316 in the surface 302 of the chuck. Channels 318 are provided for fluid for temperature regulation around the interior of the chuck. Radial slots 320 are provided on the surface 302 on the chuck connected to the well 316. Slot stops 322 block the slot and force the helium under the wafer.

To hold the wafer firmly to the chuck a multiplicity of clamps are provided. From 3 to about 72 clamps can be used on a six-inch wafer. For smaller wafers, fewer can be used, and for larger wafers, more can be used. Eight are shown here for simplicity. Each clamp comprises a thin hook 324 of sheet metal connected to a spring 326 arranged around the outside of the wafer. There is a spreading ring 328 provided with a slot 330 through which each hook 324 passes. The slot 330 is optional as the hooks sit on the lifting ring 332 without the slots. There is a lifting ring 332 below the spreading ring 328. The spreading ring is provided with two or more pneumatic actuators 334 (three are shown here) and bellows vacuum seal 336. The lifting ring 332 is likewise provided with two or more pneumatic actuators 338 (three are shown here) and bellows vacuum seal 340.

Each hook 324 has an upper holding lip 342, lower spreading lip 344 and lifting slot 346. In a motion with the hooks going from the upper and spread position to a down and clamped position, the spring 326 forces the hook 324 to pivot around the lifting ring 332 at the lifting slot 340 and push against the edge of the wafer 300, thus, centering the wafer amongst the hooks. In a motion with the hooks going from the down and clamped position to an upper and spread position, the lifting ring 332 is lifted toward the wafer, the hook 324 is forced upward releasing the pressure on the top of the wafer at the holding lip 342. As the spreading ring 328 is lowered to pressure the hook 324 at the spreading lip 344, the hook 324 pivots outward around the lifting slot 346. The holding lip 342 then swings clear of the wafer 300 and the lifting pins 304 can be used to lift the wafer to the handling arm. A capacitance sensor 348 and/or an optical sensor 350 and/or a backside pressure sensor (not shown) can be used to sense the presence of the wafer 300. This information is sent to the system computer 24. The main body of the chuck 352 can be removed to service the sensors 348 or 350 by removing the bolts 354 while leaving the clamping mechanism in place. For either embodiment of the wafer holding chuck, the chuck may be heated with cartridge heaters and cooled with a fluid such as water. Alternately, the fluid may be heated and cooled externally. The temperature of the chuck can be monitored with sensors and the temperature can be regulated with the aid of a control computer which may be combined with the processing computer 24.

In FIG. 19, the task locator system is diagrammed. Here a system of two process chambers, three valves with wafer handlers and two loadlocks are used in this example. Any number of process chambers could be used with corresponding valves and wafer handlers. At the top left of this diagram various task symbols are defined. For example, SND means vent or pump down the sender loadlock. Various task status symbols are defined at the right of the diagram. Status #1 means the element is not ready or waiting to do anything. Status #2 means the element is ready to operate with a wafer present to be operated upon. Status #3 means the element is active. This code is not used in the matrix of the diagram in FIG. 19, but is defined for the sake of completeness. Only the absence of activity is needed for a given task to operate. Status #4 means the element can be in status 1 or 2, but not 3. The fifth status symbol "any" means element can be in any of the other four status conditions. There is a difference between states of the tasks which can be only 1, 2 or 3 and the required state which can be also 1, 2 or the combinations 4 and 5. Most tasks proceed from 1 to 2 to 3 and back to 1, except SND which proceeds from 1 to 2 to 3 and back to 2. A few examples will be given here to help understand the meaning of these status categories.

When there is no wafer in a process chamber, the status of C1P, for example, is #1. After the wafer is moved into the chamber, the status changes to #2. Then the process begins and the status is changed to #3. When the process is finished the status changes back to #1. The valves will proceed through the same sequence of changes of status, but presence of a wafer is detected in the upstream compartment rather than in the valve itself. The only time there is a wafer in the valve itself is when the valve is active.

The task locator system senses the actual status of each element of the system and stores that status in the computer according to the three categories of status named above. Each element is instructed to act independently of the actions of each other element if the status conditions of the other elements are correct. The system does not operate according to a fixed timed sequence.

The task locator continuously compares actual status of the tasks labelled on the left of the matrix with each of the columns showing required status in the table diagrammed in FIG. 19 to determine if any task may be started. If the conditions are as shown in the table, it then starts those tasks and updates the status for the next time.

In this way, an optimum sequence will evolve regardless of the relative durations of each of the tasks. This is because the task locator does not attempt to define a sequence, but rather pursues the more abstract goal of keeping the system as busy as possible at all times.

For example, in order to determine under what conditions the receiver valve between the second process chamber and the receiver loadlock will operate, read across the row of task names at the top to WRM, the second column from the end. Then read down to each status symbol and across to the left for the task name. The system doesn't care what the sender loadlock is doing, nor the first valve, nor whether the first process chamber is active or not. It does demand that valve #2 between the chambers be inactive (W2M=4), that the process in the second process chamber be completed (C2P=1), that the receiver valve is ready to operate with a wafer present in the second process chamber (WRM=2), and the receiver loadlock be empty (RCV=1). Under these conditions the receiver valve will operate regardless of sequence.

This invention is not limited to the preferred embodiments and alternatives heretofore described, to which variations and improvements may be made including mechanically and electrically equivalent modifications, changes and adaptations to component parts, without departing from the scope of production of the present patent and true spirt of the invention, the characteristics of which are summarized in the appended claims.

What is claimed is:

1. A semiconductor wafer processing machine, comprising:
    a first loadlock means for receiving a cassette of semiconductor wafers for processing;
    a second loadlock means for receiving processed wafers;

at least one processing chamber;

at least two wedge valves;

said first loadlock means being in communication with a wafer processing chamber through a first wedge valve when said first wedge valve is open;

said second loadlock means being in communication with a wafer processing chamber through a second wedge valve when said second wedge valve is open;

each said loadlock means, wedge valve and processing chamber being vacuum-tight and having means for attachment to an external vacuum pumping means;

computer means for controlling each said loadlock means, wedge valve and processing chamber;

each said wedge valve including;

a valve housing having input port and output port;

a valve wedge having surfaces sealing to said input and output ports, said valve wedge sealing surfaces being sloped relative to each other, said valve wedge having a storage notch between said sealing surfaces;

means for sliding said valve wedge within said housing from a sealing position to an open position so that said valve wedge is clear of a line sight through said input and output ports;

a workpiece handling arm capable of being stored in a folded position in said storage notch when said valve is closed.

2. The machine of claim 1 wherein said arm includes:

a proximal support piece;

a proximal extensor piece;

a distal support piece, said distal support piece having means for bearing the workpiece on a distal end;

a distal extensor piece; and a pair of concentric shafts rotating about a first axis for delivering power and control to said arm, said proximal support piece being fixedly attached at right angles to a first of said concentric shafts, said proximal extensor piece being fixedly attached at right angles to a second of said pair of concentric shafts, said proximal extensor piece being pivotally attached to said distal extensor piece at a second axis, said proximal support piece and said distal extensor piece being pivotally attached to said distal support piece at third and fourth axes, respectively, said first, second, third and fourth axes being parallel, spacings between said axes forming a parallelogram.

3. The machine of claim 2 wherein said distal support arm is a flat blade.

4. The machine of claim 3 wherein said proximal extensor piece is much shorter than said proximal support piece.

5. The machine of claim 4 wherein said first loadlock means for receiving a cassette of semiconductor wafers includes:

a vacuum chamber having a door;

transmitter means for sending a closely collimated beam of radiation;

receiver means for moving the cassette past the collimated beam of radiation at a constant rate of speed;

signal processing means for translating interruptions in the collimated beam of radiation as a function of time into position information;

computer means for receiving and storing information from said signal processing means;

a small vacuum cell within the walls of the vacuum chamber, said small vacuum chamber having an opening facing the door;

sealing means for sealing the door to the vacuum chamber; and means for connecting said small vacuum cell to a vacuum pumping means.

6. The machine of claim 4 wherein said transport means is an elevator which raises and lowers the cassette with the wafers in a horizontal plane.

7. The machine of claim 5 wherein said means for connecting includes a pumping isolation valve for isolating the vacuum pumping means from the small vacuum cell.

8. The machine of claim 7 wherein said means for connecting includes a venting valve for venting said small vacuum cell to atmosphere when said isolation valve is closed.

9. The machine of claim 8 wherein said isolation valves and venting valves are operated electrically from a switch means mounted in a handle on the door.

10. The machine of claim 9 wherein said computer means includes means for operating the machine from a task locator system.

11. The machine of claim 1 including a chuck means for centering and clamping the wafer, said chuck means including:

a platform having upper surface means for supporting the workpiece;

a multiplicity of clamp means for centering and holding the workpiece on the platform, said clamp means being distributed around a perimeter of said platform, each said clamp means including a thin planar hook member and a spring member, each said thin planar hook member having an upper lip shaped to fit over the workpiece, a lower lip and a lifting slot;

a lifting ring arranged around and below said upper surface means, said lifting slot of each said thin planar hook engaging said lifting ring;

a spreading ring arranged around and below said upper surface means and above said lifting ring, said lower lip of each said thin planar hook engaging said spreading ring;

means for moving said lifting ring; and means for moving said spreading ring.

12. The device of claim 11 including lifting pin means for receiving a workpiece from a workpiece handling mechanism and lowering said workpiece to said platform.

13. The device of claim 12 including means for temperature control of said workpiece while said workpiece is held to said platform.

14. The device of claim 13 wherein said means for temperature control includes means for passing helium gas between said upper surface means of said platform and the back of the workpiece whereby to ensure thermal contact.

15. The device of claim 14 including means for removing said platform for servicing while leaving said clamp means in place.

16. The machine of claim 15 wherein said computer means includes means for operating the machine from a task locator system.

* * * * *